US009545003B2

(12) United States Patent
Rengarajan et al.

(10) Patent No.: US 9,545,003 B2
(45) Date of Patent: Jan. 10, 2017

(54) CONNECTOR FOOTPRINTS IN PRINTED CIRCUIT BOARD (PCB)

(71) Applicants: Madhumitha Rengarajan, Camp Hill, PA (US); Jan De Geest, Wetteren (BE); Stephen B. Smith, Mechanicsburg, PA (US); Stefaan Hendrik Jozef Sercu, Wuustwezel (BE)

(72) Inventors: Madhumitha Rengarajan, Camp Hill, PA (US); Jan De Geest, Wetteren (BE); Stephen B. Smith, Mechanicsburg, PA (US); Stefaan Hendrik Jozef Sercu, Wuustwezel (BE)

(73) Assignees: FCI Americas Technology LLC, Carson City, NV (US); FCI Asia Pte. Ltd., Singapore (SG)

( * ) Notice: Subject to any disclaimer, the term of this patent is extended or adjusted under 35 U.S.C. 154(b) by 0 days.

(21) Appl. No.: 14/092,039

(22) Filed: Nov. 27, 2013

(65) Prior Publication Data

US 2014/0182891 A1 Jul. 3, 2014

Related U.S. Application Data

(60) Provisional application No. 61/747,014, filed on Dec. 28, 2012.

(51) Int. Cl.
*H05K 1/11* (2006.01)
*H05K 1/02* (2006.01)

(52) U.S. Cl.
CPC ............. *H05K 1/116* (2013.01); *H05K 1/0222* (2013.01); *H05K 1/0251* (2013.01); *H05K 2201/09636* (2013.01); *H05K 2201/09718* (2013.01); *H05K 2203/0207* (2013.01); *H05K 2203/0242* (2013.01)

(58) Field of Classification Search
CPC .......... H05K 1/111; H05K 1/112; H05K 3/429
USPC .................. 174/260–262; 361/760, 792–795
See application file for complete search history.

(56) References Cited

U.S. PATENT DOCUMENTS 4,675,789 A * 6/1987 Kuwabara ............... H05K 1/116
                                                    174/262
5,068,520 A   11/1991 Sato
5,191,174 A * 3/1993 Chang .................... H05K 1/115
                                                    174/266

(Continued)

OTHER PUBLICATIONS

Extended European Search Report for European Application No. 13866930.4 dated Jul. 6, 2016.

(Continued)

*Primary Examiner* — Jeremy C. Norris
*Assistant Examiner* — Muhammed Azam
(74) *Attorney, Agent, or Firm* — Wolf, Greenfield & Sacks, P.C.

(57) ABSTRACT

An electrical connector footprint on a printed circuit board (PCB) can include vias and antipads surrounding those vias. While conventional antipads surrounding vias are large in order to improve impedance of the PCB, the presence of the antipads can compromise the integrity of the ground plane and can permit cross talk to arise between differential pairs on different layers in the PCB. Antipads can be constructed and arranged so as to limit cross talk between layers in a PCB, while also maximizing impedance.

25 Claims, 9 Drawing Sheets

(56) References Cited

U.S. PATENT DOCUMENTS

| | | | | |
|---|---|---|---|---|
| 5,296,651 A * | 3/1994 | Gurrie | | H05K 1/0218 |
| | | | | 174/250 |
| 5,764,489 A * | 6/1998 | Leigh | | H05K 1/0219 |
| | | | | 174/261 |
| 5,847,327 A * | 12/1998 | Fischer | | H01L 23/49827 |
| | | | | 174/258 |
| 6,191,472 B1 * | 2/2001 | Mazumder | | H01L 23/5383 |
| | | | | 257/683 |
| 6,225,568 B1 * | 5/2001 | Lin | | H05K 1/0224 |
| | | | | 174/117 FF |
| 6,229,095 B1 * | 5/2001 | Kobayashi | | H05K 1/0216 |
| | | | | 174/255 |
| 6,232,560 B1 * | 5/2001 | Lin | | H01L 23/49838 |
| | | | | 174/256 |
| 6,236,572 B1 * | 5/2001 | Teshome | | H05K 1/0219 |
| | | | | 174/261 |
| 6,246,112 B1 * | 6/2001 | Ball | | H01L 23/49822 |
| | | | | 257/690 |
| 6,250,968 B1 * | 6/2001 | Winings | | H05K 1/0228 |
| | | | | 174/250 |
| 6,281,451 B1 * | 8/2001 | Chan | | H01B 7/0861 |
| | | | | 174/262 |
| 6,312,621 B1 | 11/2001 | Pedigo et al. | | |
| 6,326,557 B1 * | 12/2001 | Cheng | | H05K 1/0216 |
| | | | | 174/255 |
| 6,356,166 B1 * | 3/2002 | Goldsmith | | H01P 1/185 |
| | | | | 333/161 |
| 6,372,996 B2 * | 4/2002 | Lin | | 174/117 FF |
| 6,388,890 B1 * | 5/2002 | Kwong | | H05K 1/112 |
| | | | | 174/255 |
| 6,419,526 B1 | 7/2002 | Fair | | |
| 6,442,041 B2 * | 8/2002 | Rehm | | H01L 23/5383 |
| | | | | 174/255 |
| 6,521,842 B2 * | 2/2003 | Brinthaupt, III | | H05K 1/0201 |
| | | | | 174/252 |
| 6,570,102 B2 * | 5/2003 | Miller | | H01L 23/49822 |
| | | | | 174/261 |
| 6,608,258 B1 * | 8/2003 | Kwong | | H05K 1/14 |
| | | | | 174/258 |
| 6,652,318 B1 | 11/2003 | Winings | | |
| 6,963,493 B2 | 11/2005 | Galvagni | | |
| 7,045,719 B1 * | 5/2006 | Alexander | | H05K 1/0251 |
| | | | | 174/262 |
| 7,167,373 B1 * | 1/2007 | Hoang | | H01L 23/3128 |
| | | | | 174/254 |
| 7,232,959 B2 * | 6/2007 | Hsu | | H05K 1/0228 |
| | | | | 174/113 R |
| 7,326,856 B2 * | 2/2008 | Takada | | 174/250 |
| 7,336,502 B1 * | 2/2008 | Goergen | | H05K 1/0251 |
| | | | | 361/780 |
| 7,402,757 B1 * | 7/2008 | Noujeim | | H05K 1/0216 |
| | | | | 174/255 |
| 7,501,586 B2 | 3/2009 | Wig et al. | | |
| 7,583,513 B2 * | 9/2009 | Boggs | | H05K 1/0268 |
| | | | | 174/264 |
| 7,615,709 B2 * | 11/2009 | Goergen | | H05K 1/0218 |
| | | | | 174/262 |
| 7,669,321 B1 * | 3/2010 | Levy | | H05K 1/0268 |
| | | | | 174/260 |
| 7,830,223 B2 | 11/2010 | Ahmad | | |
| 7,868,257 B2 * | 1/2011 | Kushta et al. | | 174/262 |
| 7,999,192 B2 | 8/2011 | Chan et al. | | |
| 8,008,580 B2 * | 8/2011 | Hsu | | H05K 1/024 |
| | | | | 174/254 |
| 8,022,309 B2 * | 9/2011 | Pai | | H05K 1/0224 |
| | | | | 174/254 |
| 8,035,980 B2 * | 10/2011 | Cheng | | H01P 3/026 |
| | | | | 174/250 |
| 8,058,557 B2 * | 11/2011 | Liu | | H05K 1/0245 |
| | | | | 174/250 |
| 8,058,559 B2 * | 11/2011 | Muro | | H05K 1/0218 |
| | | | | 174/254 |
| 8,143,526 B2 * | 3/2012 | Hsu | | H05K 1/0245 |
| | | | | 174/254 |
| 8,248,816 B2 | 8/2012 | Fung | | |
| 8,270,180 B2 * | 9/2012 | Liu | | H05K 1/0251 |
| | | | | 174/262 |
| 8,598,460 B2 * | 12/2013 | Contreras | | G11B 5/486 |
| | | | | 174/115 |
| 8,878,077 B2 * | 11/2014 | Ito | | H01L 21/486 |
| | | | | 174/257 |
| 8,988,093 B2 * | 3/2015 | Rathburn | | G01R 31/2889 |
| | | | | 324/755.01 |
| 9,054,097 B2 * | 6/2015 | Rathburn | | H01L 21/4867 |
| 9,165,897 B2 * | 10/2015 | Lee | | H01L 24/06 |
| 2001/0004944 A1 * | 6/2001 | Nakamura | | H05K 3/3484 |
| | | | | 174/262 |
| 2001/0010271 A1 * | 8/2001 | Lin | | H05K 1/0224 |
| | | | | 174/255 |
| 2002/0054467 A1 * | 5/2002 | Tsai | | H01L 23/49822 |
| | | | | 361/302 |
| 2002/0060366 A1 * | 5/2002 | Kikuchi | | H01L 23/13 |
| | | | | 257/776 |
| 2002/0130737 A1 * | 9/2002 | Hreish | | H03H 7/0115 |
| | | | | 333/204 |
| 2003/0006061 A1 | 1/2003 | Brinthaupt, III et al. | | |
| 2003/0196832 A1 * | 10/2003 | Peterson | | H05K 1/0218 |
| | | | | 174/255 |
| 2003/0201123 A1 * | 10/2003 | Kistner | | 174/261 |
| 2004/0091719 A1 * | 5/2004 | Uchida | | H05K 1/0274 |
| | | | | 428/429 |
| 2004/0103383 A1 * | 5/2004 | Tripathi | | H05K 1/0239 |
| | | | | 716/120 |
| 2004/0108131 A1 * | 6/2004 | Achari et al. | | 174/255 |
| 2004/0256731 A1 * | 12/2004 | Mao | | C08L 65/00 |
| | | | | 257/773 |
| 2005/0039950 A1 * | 2/2005 | Chan | | H01L 25/0652 |
| | | | | 174/262 |
| 2005/0067187 A1 * | 3/2005 | Hsu | | H05K 1/0228 |
| | | | | 174/255 |
| 2005/0128672 A1 * | 6/2005 | Tourne | | H05K 3/0047 |
| | | | | 361/119 |
| 2005/0161254 A1 | 7/2005 | Clink et al. | | |
| 2005/0183883 A1 * | 8/2005 | Bois | | H05K 1/024 |
| | | | | 174/255 |
| 2005/0205295 A1 * | 9/2005 | Tsuk | | H05K 1/0233 |
| | | | | 174/256 |
| 2005/0274544 A1 * | 12/2005 | Cosman et al. | | 174/257 |
| 2006/0118332 A1 | 6/2006 | Benham | | |
| 2006/0151869 A1 * | 7/2006 | Gisin et al. | | 257/698 |
| 2006/0237223 A1 * | 10/2006 | Chen | | H05K 1/0218 |
| | | | | 174/255 |
| 2006/0245137 A1 | 11/2006 | David et al. | | |
| 2007/0074905 A1 * | 4/2007 | Lin | | G06F 17/5068 |
| | | | | 174/263 |
| 2007/0294890 A1 | 12/2007 | Gisin et al. | | |
| 2008/0018483 A1 * | 1/2008 | Kang | | G01K 1/024 |
| | | | | 340/584 |
| 2008/0079140 A1 * | 4/2008 | Salmon | | H01L 21/6835 |
| | | | | 257/700 |
| 2008/0087461 A1 * | 4/2008 | Farkas et al. | | 174/266 |
| 2008/0101050 A1 * | 5/2008 | Fung | | 361/794 |
| 2008/0173469 A1 * | 7/2008 | Hirakawa | | H05K 1/0219 |
| | | | | 174/255 |
| 2008/0264673 A1 * | 10/2008 | Chi | | G06F 13/409 |
| | | | | 174/250 |
| 2009/0014206 A1 * | 1/2009 | Motohashi | | H05K 1/114 |
| | | | | 174/262 |
| 2009/0044968 A1 * | 2/2009 | Pai | | H05K 1/0224 |
| | | | | 174/254 |
| 2009/0045889 A1 * | 2/2009 | Goergen et al. | | 333/175 |
| 2009/0056983 A1 * | 3/2009 | Liu | | H05K 1/0245 |
| | | | | 174/255 |
| 2009/0056999 A1 | 3/2009 | Kashiwakura | | |
| 2009/0065238 A1 * | 3/2009 | Liu | | H05K 1/0245 |
| | | | | 174/250 |

(56) References Cited

U.S. PATENT DOCUMENTS

| | | | |
|---|---|---|---|
| 2009/0078452 A1* | 3/2009 | Pai | H05K 1/0245 174/254 |
| 2009/0086452 A1* | 4/2009 | Liu | H05K 1/0245 361/780 |
| 2009/0188699 A1* | 7/2009 | Lin | H05K 1/0245 174/250 |
| 2009/0188710 A1* | 7/2009 | Senk | H05K 1/115 174/262 |
| 2009/0242244 A1* | 10/2009 | Hsu | H05K 1/0245 174/255 |
| 2009/0260860 A1* | 10/2009 | Pai | H05K 1/0224 174/254 |
| 2009/0260864 A1* | 10/2009 | Lee | H05K 1/0236 174/260 |
| 2010/0000778 A1* | 1/2010 | Wang | H05K 1/0251 174/266 |
| 2010/0258338 A1* | 10/2010 | Hsu | H05K 1/024 174/254 |
| 2010/0307795 A1* | 12/2010 | Chen | H05K 1/025 174/250 |
| 2011/0017498 A1* | 1/2011 | Lauffer | H05K 3/4676 174/256 |
| 2011/0079422 A1* | 4/2011 | Kushita | H05K 1/0245 174/266 |
| 2012/0160538 A1 | 6/2012 | Contreras et al. | |
| 2012/0193128 A1 | 8/2012 | Olsen | |
| 2012/0228006 A1* | 9/2012 | Chen | H05K 1/0219 174/251 |
| 2013/0112465 A1* | 5/2013 | Duvanenko | H05K 1/0216 174/260 |

OTHER PUBLICATIONS

International Search Report and Written Opinion for Application No. PCT/US2013/074551 mailed Apr. 15, 2014.
International Preliminary Report on Patentability for Application No. PCT/US2013/074551 mailed Jul. 9, 2015.

* cited by examiner

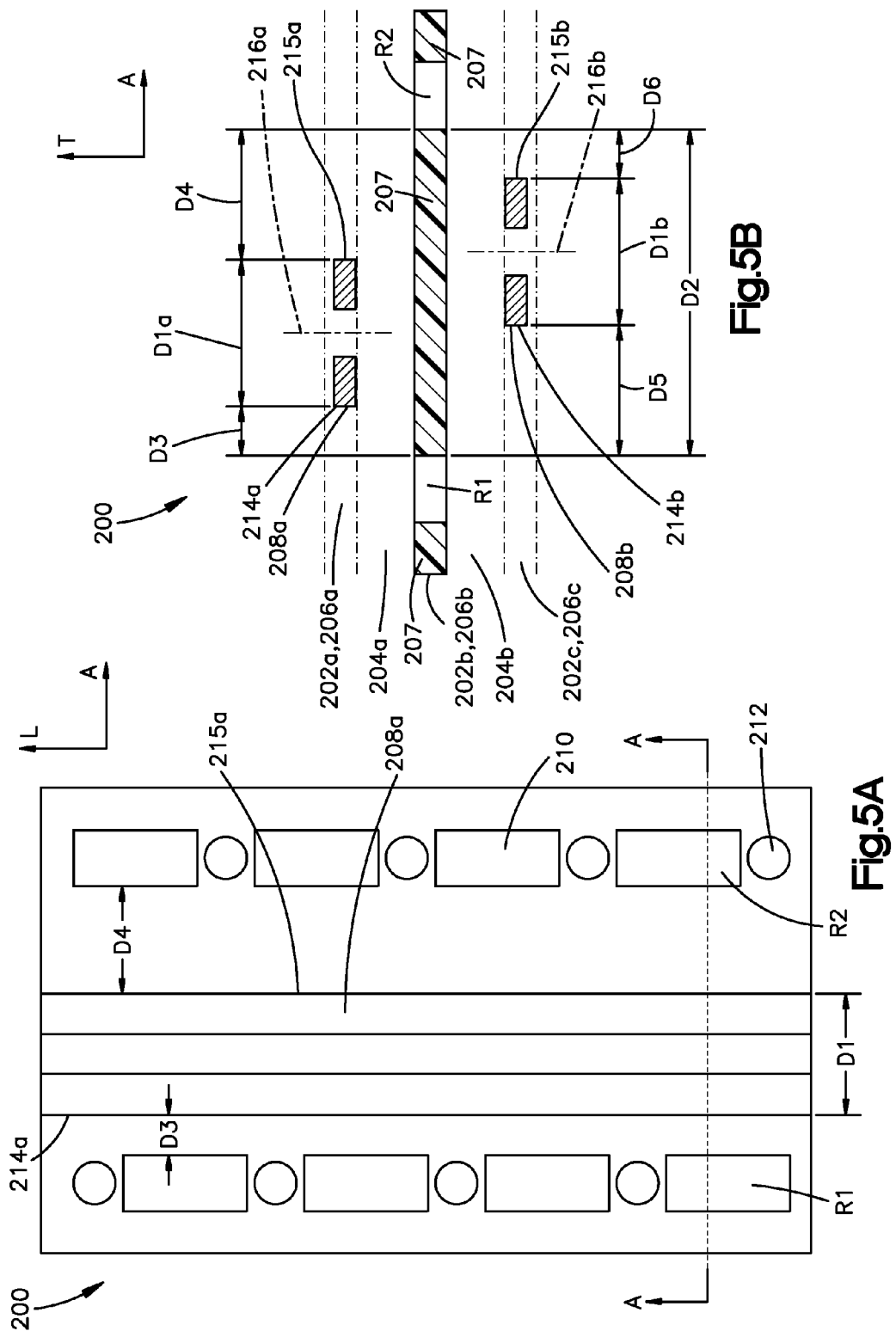

CONNECTOR FOOTPRINTS IN PRINTED CIRCUIT BOARD (PCB)

CROSS-REFERENCE TO RELATED APPLICATIONS

This application claims the benefit of U.S. Provisional Application No. 61/747,014 filed Dec. 28, 2012, the disclosure of which is hereby incorporated by reference as if set forth in its entirety herein.

BACKGROUND

Typical electrical connector footprints, such as on printed circuit boards (PCB), contain vias and antipads surrounding those vias. While conventional antipads surrounding vias are large in order to improve impedance of the PCB, the very presence of the antipads compromises the integrity of the ground plane and permits cross talk to arise between differential pairs on different layers in the PCB.

SUMMARY

In accordance with one embodiment, a printed circuit board (PCB) can include a first electrically conductive layer that includes a first electrically conductive region and a first antipad defined by the first electrically conductive region. The first antipad can include a first dielectric region and a portion of a first electrically plated via that extends through the first dielectric region along a first direction. The first antipad can have a first maximum area along a first plane that is normal to the first direction, wherein the first dielectric region is aligned with the first electrically conductive region along the first plane. The PCB can further include a first dielectric layer that is disposed below the first electrically conductive layer along the first direction. The PCB can further include a second electrically conductive layer that is disposed below the first dielectric layer along the first direction. The second electrically conductive layer can include a second electrically conductive region and a second antipad defined by the second electrically conductive region. The second antipad can have a second maximum area along a second plane that is normal to the first direction. The second maximum area can be less than the first maximum area. The PCB can further include a third electrically conductive layer disposed below the second electrically conductive layer along the first direction such that no additional electrically conductive layer is disposed between the second electrically conductive layer and the third electrically conductive layer along the first direction. The third electrically conductive layer can define a third electrically conductive region and a third antipad. The third antipad can have a third maximum area along a third plane that is normal to the first direction. The third maximum area can be substantially equal to the second maximum area, wherein at least a portion of each of the second antipad and the third antipad is aligned with the portion of the first electrically plated via along the first direction.

In accordance with another embodiment, a PCB can include a first differential pair of electrical signal traces that defines a first centerline centrally disposed between the electrical signal traces of the first differential signal pair. The PCB can further include a second differential pair of electrical signal traces spaced from the first differential pair along a first direction, the second differential pair defining a second centerline centrally disposed between the electrical signal traces of the second differential signal pair. The PCB can further include an electrically conductive layer disposed between the first differential signal pair and the second differential signal pair along the first direction. The electrically conductive layer can include an electrically conductive region and first and second antipads that are defined by the electrically conductive region. The first and second antipads can be spaced from each other along a second direction that is perpendicular to the first direction, wherein each of the first and second differential pairs can be disposed between the first and second antipads with respect to the second direction. The first centerline can be disposed closer to the first antipad than the second antipad along the second direction, and the second centerline can be disposed closer to the second antipad than the first antipad along the second direction.

BRIEF DESCRIPTION OF THE DRAWINGS

The foregoing summary, as well as the following detailed description of an example embodiment of the application, will be better understood when read in conjunction with the appended drawings. For the purposes of illustrating the present disclosure, there is shown in the drawings example embodiments. It should be understood, however, that the application is not limited to the precise arrangements and instrumentalities shown. In the drawings:

FIG. 5A is a top view of a printed circuit board in accordance with another embodiment; and FIG. 5B is a side sectional view of the printed circuit board illustrated in FIG. 5A.

DETAILED DESCRIPTION OF ILLUSTRATIVE EMBODIMENTS

Figure 1A:
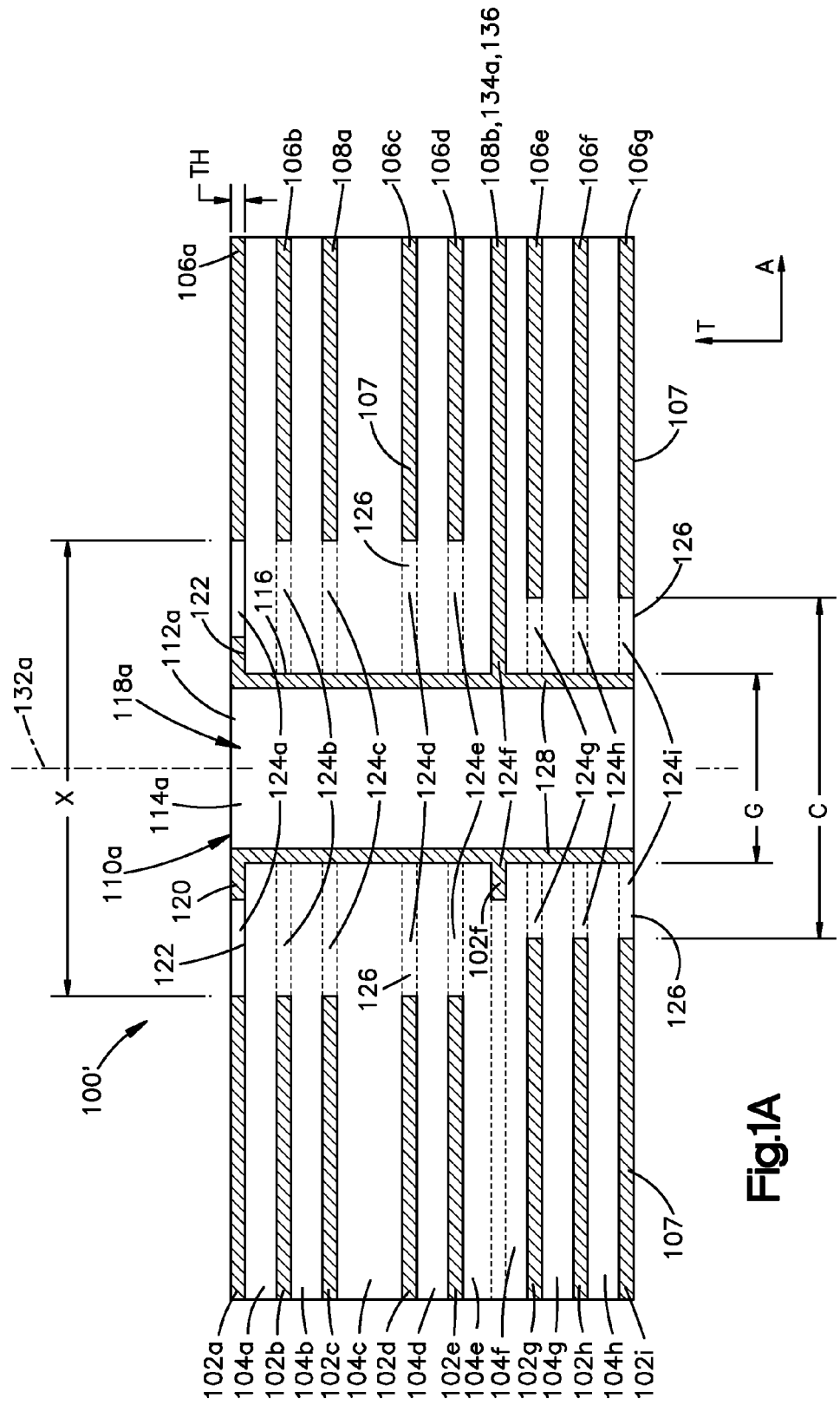
FIGS. 1A and 1B are side sectional views of a segment of a printed circuit board in accordance with an example embodiment.

Referring generally to FIGS. 1A-4B, a printed circuit board (PCB) can include one or more electrically conductive layers and one or more dielectric or electrically insulative layers. The electrically conductive layers can be configured as electrically conductive ground layers or electrically conductive signal layers. The electrically conductive ground layers can include a conductive region and an antipad defined by the conductive region.

For convenience, the same or equivalent elements in the various embodiments illustrated in the drawings have been identified with the same reference numerals. Certain terminology is used in the following description for convenience only and is not limiting. The words "left," "right," "front," "rear," "upper," and "lower" designate directions in the drawings to which reference is made. The words "forward," "forwardly," "rearward," "inner," "inward," "inwardly," "outer," "outward," "outwardly," "upward," "upwardly," "downward," and "downwardly" refer to directions toward and away from, respectively, the geometric center of the object referred to and designated parts thereof. The terminology intended to be non-limiting includes the above-listed words, derivatives thereof and words of similar import.

Figure 1B:
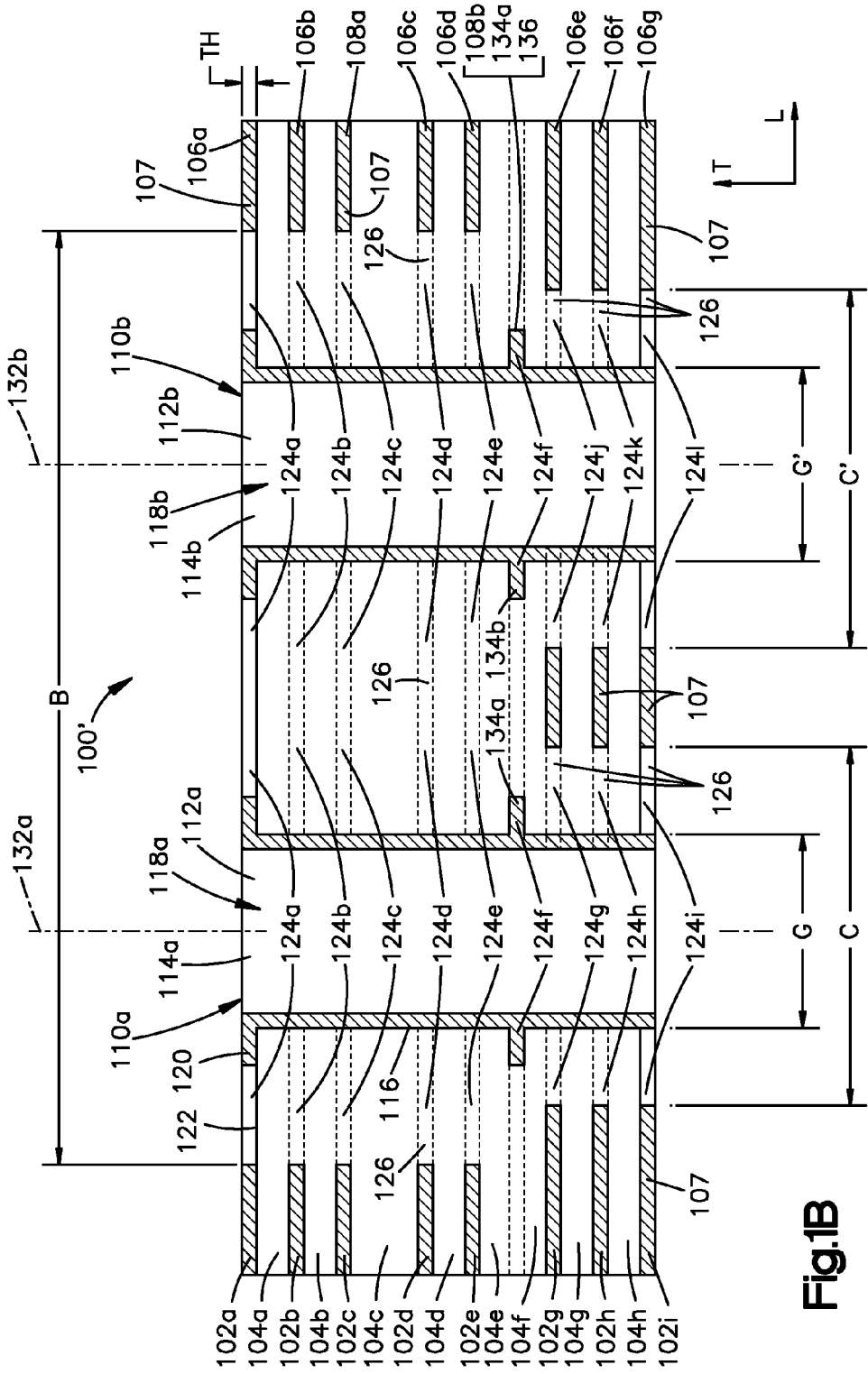
Figure 2A:
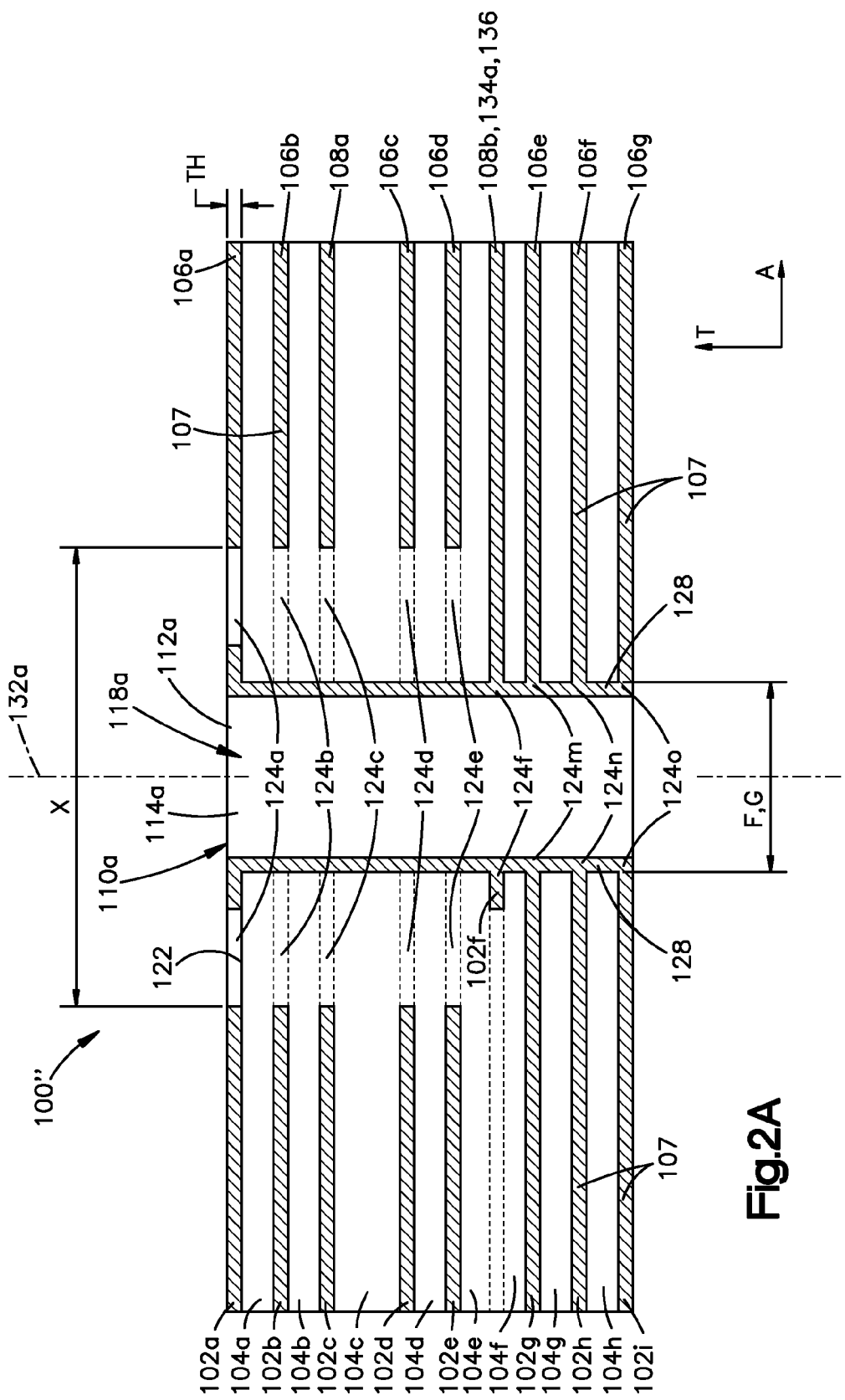
FIGS. 2A and 2B are side sectional views of a segment another printed circuit board in accordance with another example embodiment.
Figure 2B:
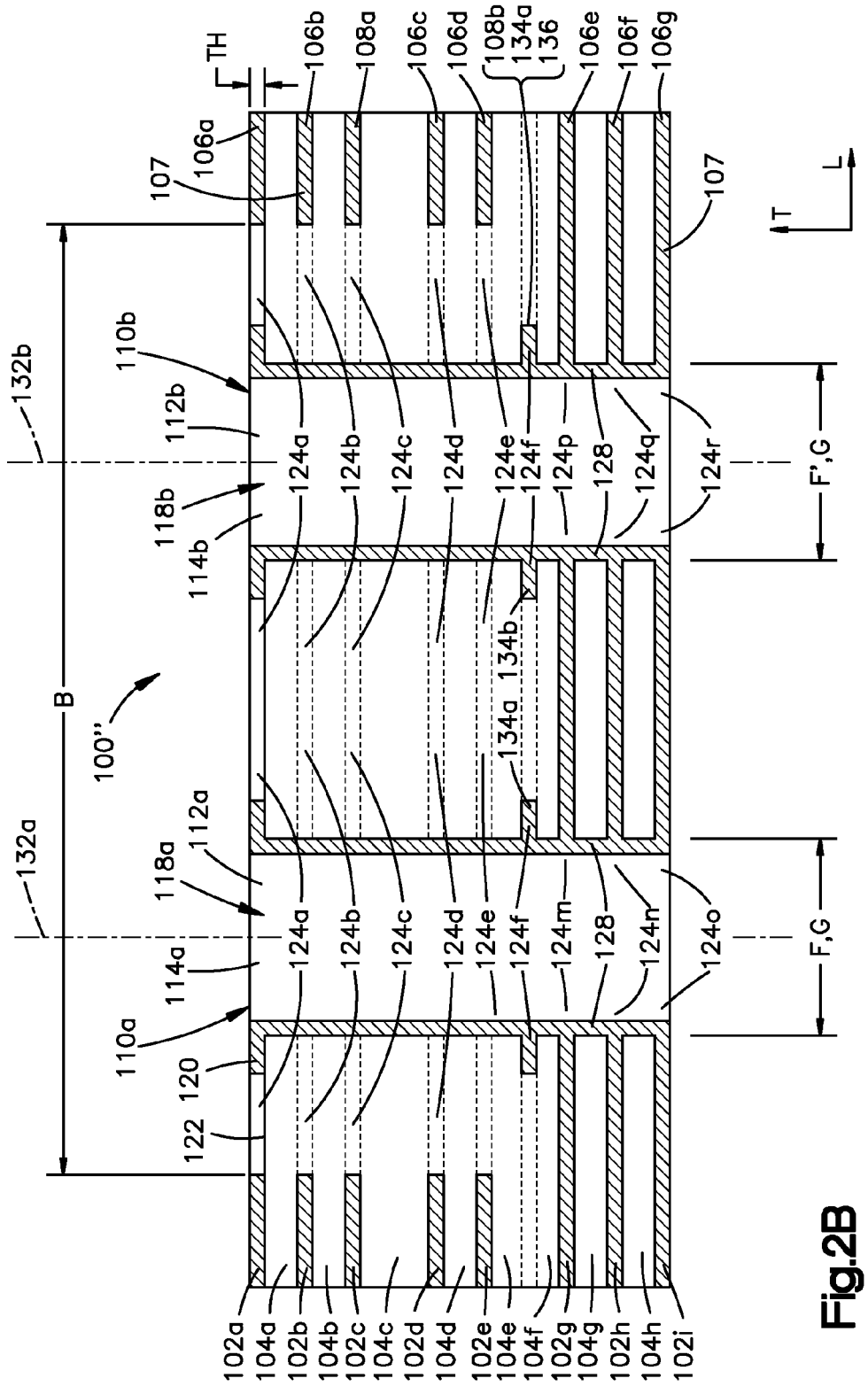

Referring initially to FIGS. 1A-2B, a PCB, for instance a PCB 100' shown in FIG. 1A-B or a PCB 100" shown in FIGS. 2A-B, can include one or more electrically conductive layers 102. In accordance with the illustrated embodiments, the PCB 100' and the PCB 100" each include nine conductive layers 102a-i, although it will be understood that the PCB can include any number of conductive layers 102 as desired. The PCB 100' and the PCB 100" each define a top layer, for instance the electrically conductive layer 102a, which can also be referred to as the top layer 102a in accordance with illustrated embodiment. The PCB 100' and the PCB 100" each further define a bottom layer that is spaced from the top layer along a first or transverse direction T. In accordance with illustrated embodiments, the electrically conductive layer 102i defines the bottom layer, and thus the electrically conductive layer can also be referred to as the bottom layer 102i. Each of the electrically conductive layers 102 define a thickness TH as measured along the transverse direction T. The printed circuit boards (PCBs) 100' and 100" can each include a top surface 122 that supports the electrically conductive layer 102a.

Various structures are described herein as extending vertically along the first or transverse direction "T" that is substantially perpendicular to a second or lateral direction "A" and a third or longitudinal direction "L", and horizontally along the lateral direction A and the longitudinal direction L that is substantially perpendicular to the lateral direction A. As illustrated, the transverse direction "T" extends along an upward/downward direction of the PCBs 100' and 100". For instance, a direction from the top layer 102a toward the bottom layer 102i defines the downward direction, and a direction from the bottom layer 102i to the top layer 102a defines the upward direction. Thus, for instance, a first layer that is disposed in the upward direction from a second layer can be referred to as being above the second layer, and the second layer that is disposed in the downward direction from the first layer can be referred to as being below the first layer.

Thus, unless otherwise specified herein, the terms "lateral," "longitudinal" and "transverse" are used to describe the orthogonal directional components of various components. It should be appreciated that while the longitudinal and lateral directions are illustrated as extending along a horizontal plane, and that while the transverse direction is illustrated as extending along a vertical plane, the planes that encompass the various directions may differ during use, depending, for instance, on the orientation of the various components. Accordingly, the directional terms "vertical" and "horizontal" are used to describe the PCBs and its components as illustrated merely for the purposes of clarity and convenience, it being appreciated that these orientations may change during use.

The PCBs 100' and 100" can further include one or more dielectric or electrically insulative layers 104, such as a plurality of dielectric layers or electrically insulative layers 104a-h, that are disposed between the conductive layers 102a-i along the transverse direction T. For instance, each dielectric layer 104 can be disposed between a select two conductive layers 102 to electrically isolate the select two conductive layers 102 from each other. Thus, the select two conductive layers 102 can be referred to as consecutive layers 102 because only one dielectric layer 104 is disposed between the consecutive layers 102 along the transverse direction T. A consecutive conductive layer 102 may be understood to be the next conductive layer 102 above or below a given conductive layer 102 along the transverse direction T. For instance, in accordance with the illustrated embodiment, conductive layers 102b and 102c can be referred to as consecutive conductive layers with respect to each other because only the dielectric layer 104b is disposed between the conductive layers 102b and 102c along the transverse direction T.

The conductive layers 102 can include electrically conductive ground layers 106, electrically conductive signal layers 108, and electrically conductive power layers. In accordance with the illustrated embodiments, the conductive layers 102a-b, 102d-e, and 102g-i are configured as electrically conductive ground layers 106a-g, respectively. Further, in accordance with the illustrated embodiments, the conductive layers 102c and 102f are configured as electrically conductive signal layers 108a-b, respectively. The signal layers 108a-b can each include one or more conductive regions, such as electrically conductive traces 134a-b, which can be made of copper or any other conductive material as desired. The conductive traces 134a-b can each be part of a differential pair of signal traces 136. The ground layers 106a-g can include one or more electrically conductive regions 107, which can be made of copper or any other electrically conductive material as desired. The dielectric layers 104a-g can include dielectric or electrically nonconductive material, for instance plastic.

It will be appreciated that while FIGS. 1A-2B depict an example configuration of the PCB 100' and the PCB 100", the conductive layers 102 and the dielectric layers 104 can be arranged in a variety of sequences along the transverse direction T. Thus, the instant disclosure should not be limited to the example configuration shown in FIGS. 1A-2B.

Referring to FIGS. 1A-2B, the PCB 100' and the PCB 100" can each further include a plurality of signal vias 110, such as adjacent electrically conductive vias 110a-b, which can also be referred to as electrically plated vias 110a-b. In accordance with the illustrated embodiments, the electrically plated vias 110a-b include a respective hole 112a-b that defines a respective open end 114a-b. Further, in accordance with the illustrated embodiment, the vias 110a-b can extend into, for instance through, two or more of the conductive layers 102 and the dielectric layers 104 along the transverse direction T. The vias 110a-b can further include a conductive surface 116. Each hole 112a-b can be at least partially, for instance fully, plated with the conductive surface 116. Thus, the holes 112a-b and the conductive surface 116 can be collectively referred to as plated, through-holes 118a-b. The holes 112a-b can be configured to be at least partially, for instance fully, filled with a conductive metal. The holes 112a-b can receive an electrically conductive insert from another electronic device, such as a press fit connector for instance. In accordance with the illustrated embodiments, the vias 110a-b can be electrically connected to electrically conductive surface pads, for instance a surface pad 120 that rests on the surface 122 of the PCB 100' and 100".

The vias 110a-b are depicted in FIGS. 1A-2B as being cylindrical, although it will be appreciated that the vias can define any shape as desired. In accordance with the illustrated embodiment, each hole 112a-b of the vias 110a-b can define respective cross-sectional dimensions G and G' along the lateral direction A or the longitudinal direction L. For instance, the holes 112a-b, and thus the vias 110a-b, can be cylindrical and thus the respective cross-sectional dimensions G and G' can be diameters G and G' that extend in a plane that is normal to the transverse direction T. Thus, each of the cross-sectional dimensions G and G' can define a cross-sectional area of each via 110a-b, respectively.

Still referring to FIGS. 1A-2B, traces 134a-b of the signal layer 108b are electrically coupled to the vias 110a-b, respectively. Thus, the traces 134 in one or more of the signal layers 108 can be electrically coupled to one or more of the vias 110. In particular, the traces 134a-b can be electrically coupled to the plated, through-holes 118a-b, respectively, by contacting the conductive surfaces 116 of each of the plated, through-holes 118a-b so as to establish an electrical connection between the traces 134a-b and the vias 110a-b. The vias 110a-b can be connected to differential traces 134a-b respectively, to establish a differential pair of signal traces.

With continuing reference to FIGS. 1A-2B, one or more of the conductive layers 102 can each include one or more electrically conductive regions 107 and one or more antipads 124 that are defined by respective electrically conductive regions 107. In accordance with the illustrated embodiments, the conductive layers 102a-102i include conductive regions 107 and antipads 124a-r. Each of the antipads 124 can include a dielectric region 126 and a portion of a select electrically plated via 110 that extends through the dielectric region 126 along the transverse direction T. Thus, each of the antipads 124 can be referred to as an individual void in a respective conductive layer 102. Each antipad 124 can be surrounded by the conductive region 107 of each respective conductive layer 102. The antipads 124 may contain one or more of: a portion of one or more electrically conductive vias (such as vias 110a-b), air, or a dielectric or electrically insulative material. In an example embodiment, individual antipads 124 may surround one or more of the vias 110, such as vias 110a-b, and separate respective conductive regions 107 from the one or more vias 110a-b, thereby preventing the conductive regions 107 from contacting an electrically conductive via 110. In accordance with the illustrated embodiments, the conductive layers 102 can include conductive regions 107 and dielectric regions 126 that electrically separate the conductive regions 107 from the electrically plated vias 110. In the electrically conductive ground layer 106 for instance, the dielectric regions 126 can be disposed between the conductive regions 107 and the conductive surfaces 116 of the vias 110 along the lateral and longitudinal directions A and L such that the conductive regions 107 and the vias 110 are electrically separate. The antipads 124 can each include a portion of the vias 110. For instance, the vias 110 can define a length along the transverse direction T, and the antipads 124 can each include a portion of the length of the vias 110 along the transverse direction T.

The antipads 124 can each have a cross-sectional area along a respective plane that is normal to the transverse direction T. For instance, a select antipad 124 of a select conductive layer 102 can have a maximum cross-sectional area along a select plane that is normal to the transverse direction T. The maximum cross-sectional area can be defined by a select conductive region 107 of the select conductive layer 102, wherein the dielectric region 126 of the select antipad 124 is aligned with the select conductive region 107 along the select plane. Further, each antipad 124 can have a maximum volume which can be defined by a product of the maximum area and the thickness TH of the respective conductive layer 102.

The antipads 124 may be formed in a variety of ways. For example, each of antipads 124a-i may be created by first forming conductive regions 107 of the respective conductive layers 102a-i and then removing sections of the conductive regions 107 to create the respective dielectric regions 126 through, for example, etching. As will be explained further below, select ones of the antipads 124 may also be formed by back drilling.

Referring still to FIGS. 1A-2B, the PCB 100' includes antipads 124a-e that are above the antipads 124g-l along the transverse direction T, and the PCB 100'' includes antipads 124a-f that are above the antipads 124m-r along the transverse direction T. In accordance with the illustrated embodiments, the antipads 124a-e are depicted as being rectangular although it will be appreciated that the antipads 124a-e can assume a wide variety of shapes as desired. As illustrated, the antipads 124a-e can define a first cross-sectional dimension X defined by a longest straight line that extends from an edge of the conductive region 107 to an opposed edge of the conductive region 107 along the lateral direction X. Further, with particular reference to FIGS. 1B, 2B, 3B and 4B, the antipads 124a-e can define a second cross-sectional dimension B defined by a longest straight line that extends from an edge of the conductive region 107 to an opposed edge of the conductive region 107 along the longitudinal direction L. Thus, a maximum cross-sectional area, which can be referred to as a maximum area, of the antipads 124a-e along a respective plane that is normal to the transverse direction T can be substantially equal to a product of the first cross-sectional dimension A and the second cross-sectional dimension B. Further, the maximum cross-sectional area of the antipads 124a-e can be rectangular, and each of the antipads 124a-e can have a maximum volume that can be defined by a product of the respective maximum cross-sectional area and the thickness TH of the respective conductive layer 102. Select ones of the antipads 124, for instance the illustrated antipads 124a-e, can include portions of more than one via 110, for instance two vias 110a-b in accordance with the illustrated embodiments. Thus, the maximum cross-sectional areas of the antipads 124a-e along respective planes that are normal to the transverse direction T can be larger than maximum cross-sectional areas of the vias 110a-b along respective planes that are normal to the transverse direction T.

With particular reference to FIGS. 1A-B, the PCB 100' can include conductive layers 102g-i that include the antipads 124g-l. For instance, in accordance with the illustrated embodiment, the conductive layer 102g includes the antipads 124g and 124j spaced from each other along the longitudinal direction L, the conductive layer 102h includes the antipads 124h and 124k spaced from each other along the longitudinal direction L, and the conductive layer 102i includes the antipads 124i and 124l spaced from each other along the longitudinal direction L. It will be understood that the conductive layers 102 can include any number of antipads 124 as desired and the antipads 124 can be positioned on the respective conductive layers as desired. The antipads 124g-l are depicted as being cylindrical although it will be appreciated that the antipads 124g-l can assume a wide variety of shapes as desired. As illustrated, the antipads 124g-i can define a cross-sectional dimension C defined by a longest straight line that extends from an edge of the conductive region 107 to an opposed edge of the conductive region 107 along the lateral direction A. The cross-sectional dimension C can be a diameter C, and thus the cross-sectional dimension C can also be defined by a longest straight line that extends from an edge of the conductive region 107 to an opposed edge of the conductive region 107 along the longitudinal direction L. Similarly, as illustrated, the antipads 124j-l can define a cross-sectional dimension C' defined by a longest straight line that extends from an edge of the conductive region 107 to an opposed edge of the conductive region 107 along the longitudinal direction L. The cross-sectional dimension C' can be a cross-sectional diameter C', and thus the cross-sectional dimension C' of the antipads 124$j$-$l$ can also be defined by a longest straight line that extends from an edge of the conductive region 107 to an opposed edge of the conductive region along the lateral direction A.

With continuing reference to FIGS. 1A-B, the antipads 124$g$-$i$ and 124$j$-$l$ can have maximum cross-sectional areas, which can be referred to as maximum area, along respective planes that are normal to the transverse direction T, and the maximum cross sectional areas of the antipads 124$g$-$i$ and 124$j$-$l$ can be defined by the cross-sectional dimensions, for instance cross-sectional diameters, C and C', respectively. In accordance with the illustrated embodiment, the maximum cross-sectional areas of each of the antipads 124$g$-$l$ can be less than the maximum cross-sectional areas of each of the antipads 124$a$-$e$. Thus, the cross-sectional dimensions C and C' of the antipads 124$g$-$i$ and 124$j$-$l$, respectively, can be less than one or both of the cross-sectional dimensions X and B of the antipads 124$a$-$e$. Further, the maximum cross-sectional areas of each of the antipads (e.g., antipads 124$g$-$l$) below the signal layer 108 can be circular, or otherwise shaped differently than the antipads 124$a$-$e$ that are disposed above the signal layer 108 along the transverse direction T. Each antipad 124$g$-$l$ can have a maximum volume that can be defined by a product of the respective maximum cross-sectional area and the thickness TH of the respective conductive layer 102. Select ones of the antipads 124, for instance the illustrated antipads 124$g$-$l$, can include portions of only one via 110. For instance, in accordance with the illustrated embodiment, the antipads 124$g$-$i$ include a portion of only the via 110$a$ and the antipads 124$j$-$l$ include a portion of only the via 110$b$. The antipads 124$g$-$l$ can further include dielectric regions 126 that separate the vias 110 from the conductive regions 107 along respective planes that are normal to the transverse direction T. Thus, the maximum cross-sectional areas of the antipads 124$g$-$l$ along respective planes that are normal to the transverse direction T can be larger than maximum cross-section areas of the vias 110$a$-$b$ along respective planes that are normal to the transverse direction T. For instance, the maximum cross-sectional areas of the antipads 124$g$-$l$ can include dielectric regions 126 that electrically separate the conductive regions 107 from the electrically plated vias 110.

Thus, the PCB 100' can include a first electrically conductive layer, for instance a select one of the conductive layers 102$a$-$e$, that includes a first conductive region, for instance the conductive region 107, and a first antipad, for instance a select one of the antipads 124$a$-$e$. The first antipad can include a first dielectric region, for instance the dielectric region 126, and a portion of a first electrically plated via, for instance the via 110$a$, that extends through the first dielectric region along the transverse direction T. The first antipad can have a first maximum area along a first plane that is normal to the transverse direction T, and the first dielectric region can be aligned with the first electrically conductive region along the first plane. The PCB 100' can further include a first dielectric layer, for instance a select one of the dielectric layers 104$a$-$f$, that is disposed below the first electrically conductive layer along the transverse direction T. The PCB 100' can further include a second electrically conductive layer, for instance a select one of the conductive layers 102$g$-$i$, that is disposed below the first dielectric layer along the transverse direction T. The second electrically conductive layer can include a second electrically conductive region and a second antipad, for instance a select one of the antipads 124$g$-$i$, defined by the second electrically conductive region. The second antipad can have a second maximum area along a second plane that is normal to the transverse direction T, and the second maximum area can be less than the first maximum area.

Further, the PCB 100' can include a third electrically conductive layer, for instance a select one of the electrically conductive layers 102$h$ and 102$i$, that is disposed below the second electrically conductive layer along the transverse direction T such that that no additional electrically conductive layer is disposed between the second electrically conductive layer and the third electrically conductive layer along the transverse direction T. The third electrically conductive layer can define a third electrically conductive region and a third antipad, for instance a select one of the antipads 124$h$ and 124$i$, defined by the third electrically conductive region. The third antipad can have a third maximum area along a third plane that is normal to the transverse direction T. The third maximum area can be substantially equal to the second maximum area. As used herein, two or more values that are substantially equal to each other may refer to values that are within tolerances of a manufacturer. At least a portion of each of the second antipad and the third antipad can be aligned with the portion of the first electrically plated via along the transverse direction T.

The first antipad can further include a portion of a second electrically plated via, for instance the via 110$b$, that extends through the first dielectric region along the transverse direction T. Further, the second electrically conductive layer can include a fourth antipad, for instance a select one of the antipads 124$j$-$l$, that has a fourth maximum area along the second plane. The fourth maximum area can be substantially equal to the second maximum area. The third electrically conductive layer can further include a fifth antipad, for instance a select one of the antipads 124$k$ and 124$l$, that is defined by the third electrically conductive region. The fifth antipad can have a maximum area along the third plane. The fifth maximum area can be substantially equal to the third maximum area.

The PCB 100' can further include a second dielectric layer disposed between the second electrically conductive layer and the third electrically conductive layer such that the second dielectric layer separates the second and third electrically conductive layers from each other and the second dielectric layer abuts each of the second and third electrically conductive layers.

Referring now to FIGS. 2A-B, the PCB 100" can include conductive layers 102$g$-$i$ that include the antipads 124$m$-$r$. For instance, in accordance with the illustrated embodiment, the conductive layer 102$g$ includes the antipads 124$m$ and 124$p$ spaced from each other along the longitudinal direction L, the conductive layer 102$h$ includes the antipads 124$n$ and 124$q$ spaced from each other along the longitudinal direction L, and the conductive layer 102$i$ includes the antipads 124$o$ and 124$r$ spaced from each other along the longitudinal direction L. The antipads 124$m$-$r$ are depicted as being cylindrical although it will be appreciated that the antipads 124$m$-$r$ can assume a wide variety of shapes as desired. As illustrated, the antipads 124$m$-$o$ can define a cross-sectional dimension F defined by a longest straight line that extends from an edge of the conductive region 107 to an opposed edge of the conductive region 107 along the lateral direction A. The cross-section dimension F can be a diameter F, and thus the cross-sectional dimension F can also be defined by a longest straight line that extends from an edge of the conductive region 107 to an opposed edge of the conductive region along the longitudinal direction L. Similarly, as illustrated, the antipads 124p-r can define a cross-sectional dimension F' defined by a longest straight line that extends from an edge of the conductive region 107 to an opposed edge of the conductive region 107 along the longitudinal direction L. The cross-sectional dimension F' can be a cross-sectional diameter F', and thus the cross-sectional dimension F' of the antipads 124p-r can also be defined by a longest straight line that extends from an edge of the conductive region 107 to an opposed edge of the conductive region along the lateral direction A.

With continuing reference to FIGS. 2A-B, the antipads 124m-o and 124p-r can have maximum cross-sectional areas, which can be referred to as maximum areas, along respective planes that are normal to the transverse direction T, and the maximum cross-sectional areas of the antipads 124m-o and 124p-r can be defined by the cross-sectional dimensions, for instance cross-sectional diameters, F and F', respectively. In accordance with the illustrated embodiment, the maximum cross-sectional areas of each of the antipads 124m-r can be less than the maximum cross-sectional areas of each of the antipads 124a-e. Further, the maximum cross-sectional areas of the antipads 124m-r below the signal layer 108 can be circular, or otherwise shaped differently than the antipads 124a-e that are disposed above the signal layer 108 along the transverse direction T. Thus, the cross-sectional dimensions F and F' of the antipads 124m-o and 124p-r, respectively, can be less than one or both of the cross-sectional dimensions X and B of the antipads 124a-e. In accordance with the illustrated embodiment, for instance before back drilling of the vias 110a-b, the cross-section dimensions F and F' can be substantially equal, for instance slightly larger, to the cross-sectional dimensions G and G', respectively. Thus, before back drilling for instance, the maximum cross-section areas of the antipads 124m-r along respective planes that are normal to the transverse direction T can be substantially equal to the maximum cross-section areas of the vias 110a-b along respective planes that are normal to the transverse direction T. Before back drilling described below, the conductive regions 107 of the conductive layers 102g-i can be electrically coupled to the electrically conductive vias 110a-b, as illustrated.

In another example in which the antipads 124m-r have the cross-sectional dimensions F and F' that are slightly larger than the cross-sectional diameters G and G', respectively, the conductive regions 107 of the conductive layers 102g-i are not electrically coupled to the electrically conductive vias 110a-b. Thus, the maximum cross-section area of antipads 124m-r can include a dielectric or electrically insulative material, such as the dielectric region 126, that electrically separates the vias 110a-b from the conductive regions 107 of the conductive layers 102g-i.

Referring to FIGS. 1A-2B, the vias 110a-b can include an unused portion 128, which can be referred to as a resonant stub. The unused portion 128 may be located above or below the signal layer 108 along the transverse direction T. In accordance with the illustrated embodiments, the unused portion 128 is disposed below the signal layers 108 along the transverse direction T. The unused portion 128 of the vias 110a-b can be located below the signal layer 108b in the conductive layers 102g-i. The unused portion 128 of the vias 110a-b can be disposed in a first group of conductive layers 102 having antipads 124 that are smaller than antipads in a second group of conductive layers 102. For example, the first group may include the consecutive conductive layers 102g-i that are disposed below the signal layer 108 along the transverse direction T, and the second group may include consecutive conductive layers 102a-e that are disposed above the signal layer 108 along the transverse direction T. The first group of conductive layers 102g-i may be disposed on a side of signal layer 108b opposite the second group of conductive layers 102a-e along the transverse direction T. For example, the first group of conductive layers 102g-i may be above or below the second group of conductive layers 102a-e along the transverse direction T. The antipads 124g-r of the first group of conductive layers 102 may be smaller than the antipads 124a-e contained in the second group.

The unused portion 128 of the vias 110a-b can act as a notch filter centered around a frequency that is primarily determined by a length of the unused portion 128. The length of the unused portion 128 can be measured along the transverse direction T. The unused portion 128 can cause some of the energy of an electrical signal that is transitioning through the plated, through-hole 118 along the transverse direction T to be reflected back to the source. To mitigate this interference, the unused portions 128 of each respective via 110a-b can be removed. Referring to FIGS. 3A-4B, the unused portion 128 can be removed using, for example, a circular drill bit with a diameter H attached to a drill.

Referring to FIGS. 3A-4B, the drill may be used to back drill the PCB 100. For instance, the drill may be inserted along the upward direction to a depth such that most, for instance all, of the unused portion 128 of each respective via 110a-b is removed. For example, when inserted along the upward direction, the drill may be stopped at a location below the signal layer 108. Referring to FIGS. 2A-B and 4A-B, the drill may also remove a portion of each of the conductive regions 107 of the conductive layers 102g-i. Referring also to FIGS. 1A-B and 3A-B, the drill may also remove a portion of each of the antipads 124g-l of the conductive layers 102g-i.

Referring again to FIGS. 3A-4B, the PCB 100' and the PCB 100" can include a single back drilled cavity 130 that can be created as result of the back drilling described above. The cavity 130 can have a circular cross section as viewed along the transverse direction. The circular cross section of the cavity 130 can define a diameter H that is substantially equal to the diameter H of the drill bit. During the back drilling process, a part of the unused portions 128 of each of the vias 110a-b and portions of each of the conductive layers 102g-i may be removed. In order to avoid damaging the traces 134a-b in the signal layer 108b, a small section of the unused portion 128 may remain in the dielectric or electrically insulative layer 104f that is disposed between the conductive layers 102f and 102g along the transverse direction T. Referring to FIGS. 2A and 4A, enough of the unused portion 128 may be removed such that the conductive regions 107 of the conductive layers 102g-i are not electrically connected to either of the vias 110a-b. After back drilling, in accordance with an example embodiment, at least a portion, for instance all, of the cavity 130 can be filled, for instance back-filled, with a dielectric material, for instance a dielectric material other than air. The cavity 130 can be filled with the same dielectric material that is included in the dielectric layers 104, such as a plastic or an epoxy for example.

In accordance with the illustrated embodiments, the cavity 130 can be located below the signal layer 108b along the downward direction that extends from the layer 102a toward the layer 102i. For example, the cavity 130 may extend between the dielectric or electrically insulative layer 104f and the conductive layer 102i along the transverse direction T. The cavity 130 any be consist of any dielectric or electrically insulative material, for instance air, as desired.

For instance, after the cavity 130 is back-drilled, the cavity can be at least partially filled with a dielectric material other than air.

Thus, in accordance with the an example embodiment, a printed circuit board can include a first electrically conductive layer that includes a first electrically conductive region and a first antipad defined by the first electrically conductive region. The first antipad can include a first dielectric region and a portion of an electrically plated via that extends through the first dielectric region along a first direction. The first dielectric layer can be disposed below the first electrically conductive layer along the first direction. The printed circuit board can further include a second electrically conductive layer disposed below the first dielectric layer along the first direction. The second electrically conductive layer can include at least a portion of a back-drilled cavity that is aligned with the portion of the electrically plated via along the first direction. Further, the back-drilled cavity can be at least partially filled with a dielectric material other than air.

Figure 3A:
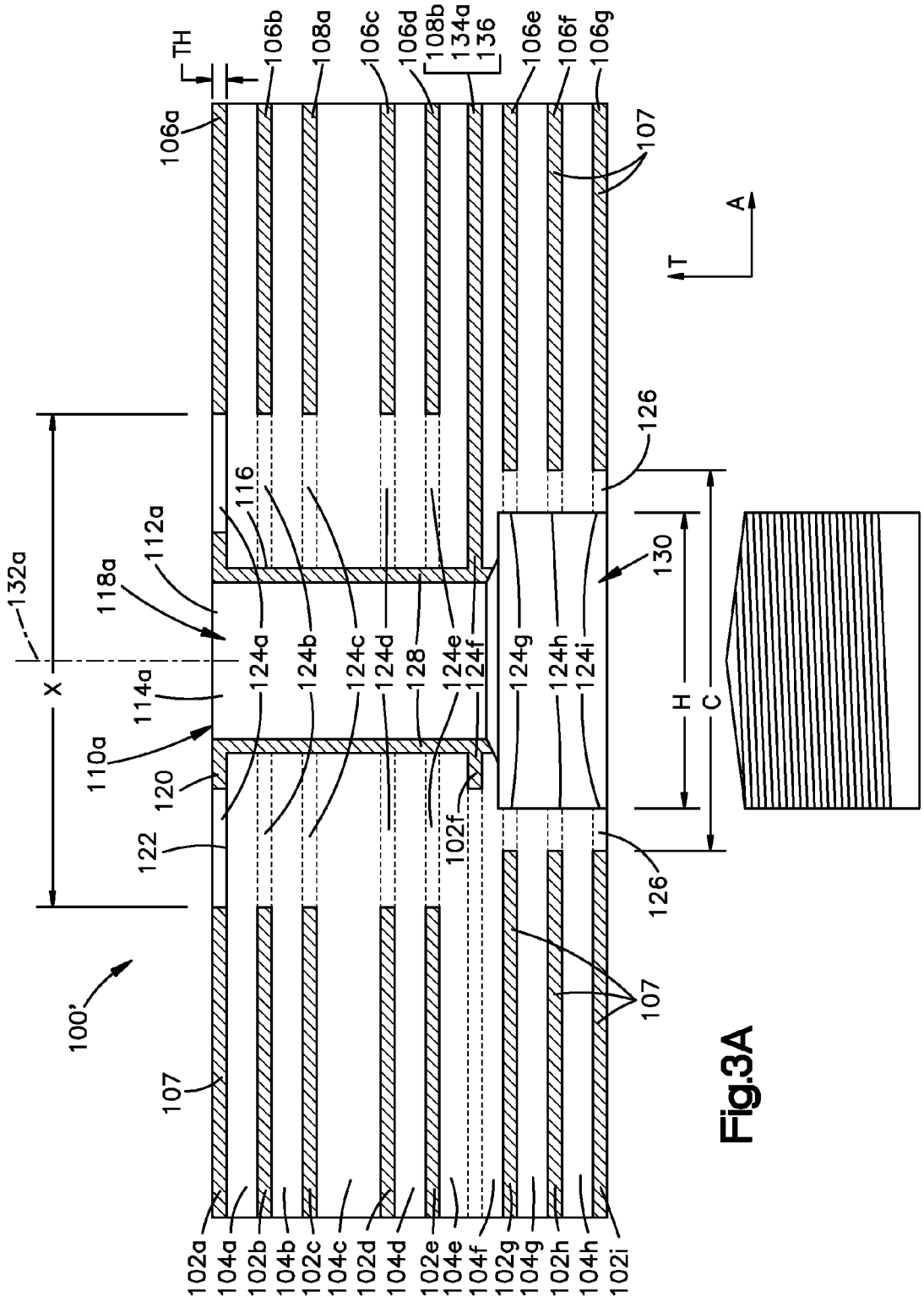
FIGS. 3A and 3B are side sectional views of the segment of the printed circuit board shown in FIGS. 1A and 1B, wherein unused portions of vias have been removed.
Figure 3B:
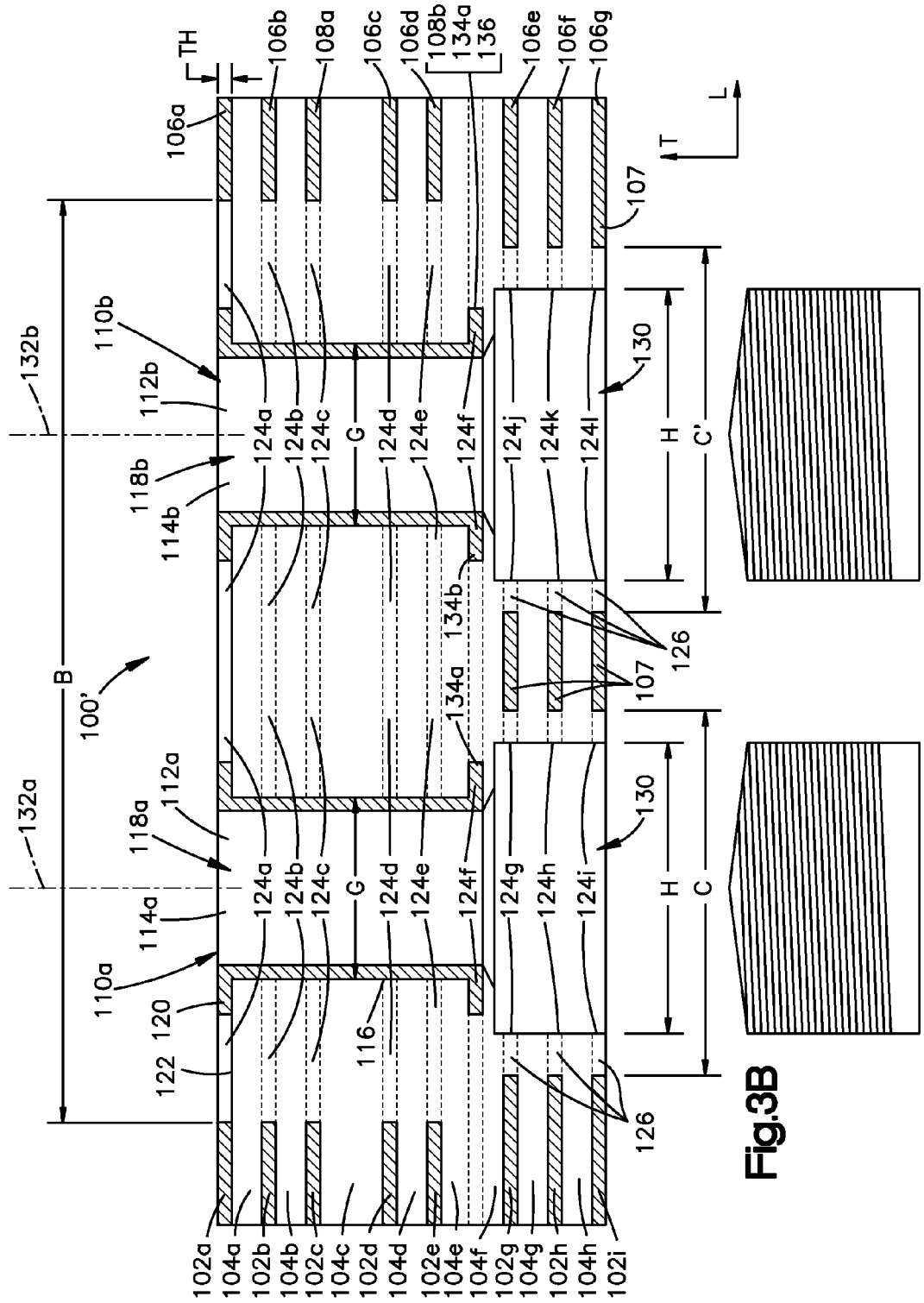
Figure 4A:
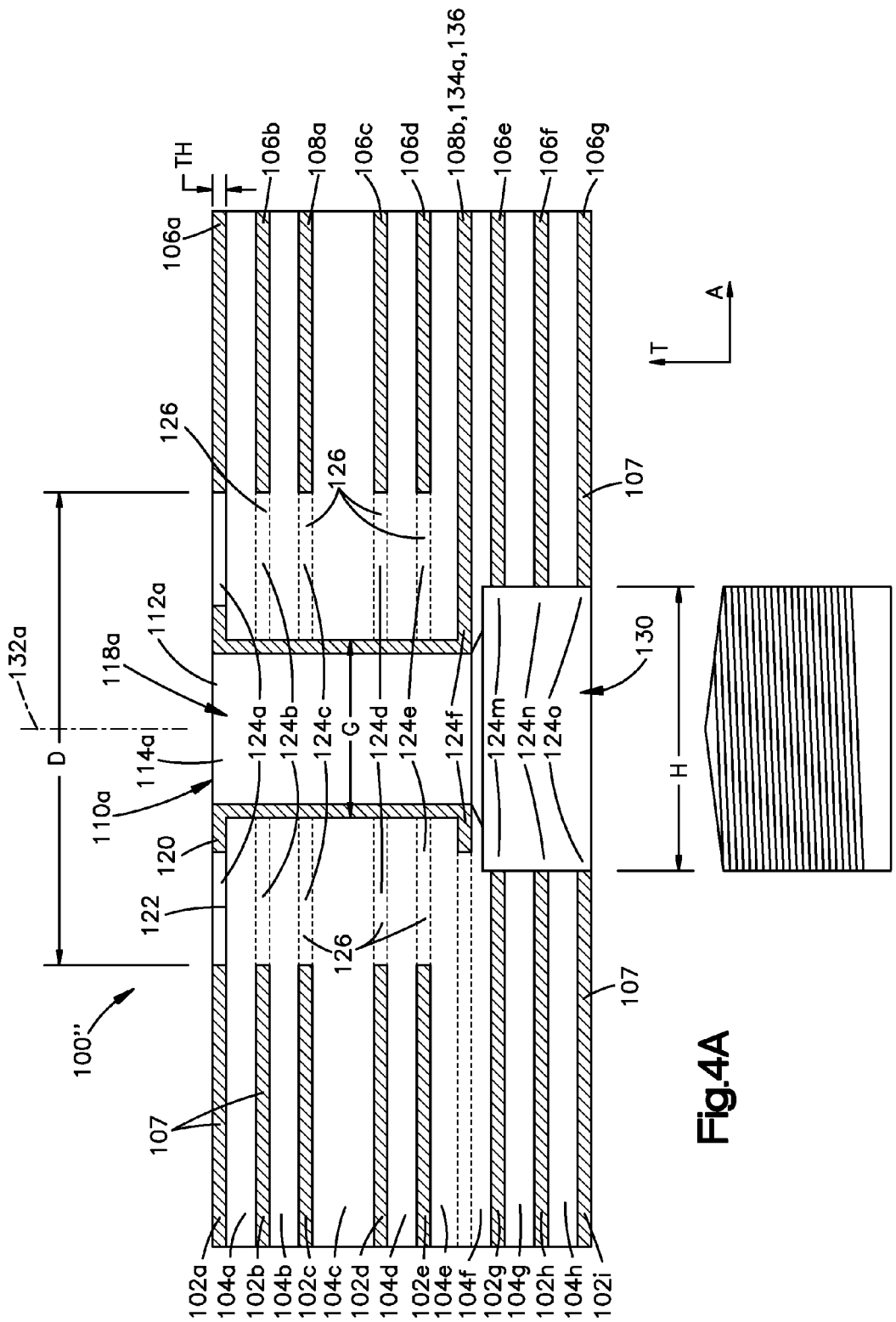
FIGS. 4A and 4B are side sectional views of the segment of the printed circuit board shown in FIGS. 2A and 2B, wherein unused portions of vias have been removed.

With particular reference to FIGS. 3A-B, after the unused portions 128 of the vias 110a-b are removed and the cavity 130 is created, in accordance with the illustrated embodiment, the cross-sectional dimensions C and C' of the antipads 124g-l can be larger than the diameter H of the cavity 130. Thus, the size of the antipads 124g-l may remain unchanged after back drilling. Further, select conductive regions 107, for instance the second and third electrically conductive regions, of the conductive layers 102g-i do not come into contact with the single back drilled cavity 130 in accordance with the illustrated embodiment shown in FIGS. 3A-B. After back drilling, each of the antipads 124g-l can include respective portions of the cavity 130, for instance instead of the vias 110a-b. Referring to FIGS. 3A-B, after back drilling, the antipads 124g-l can include respective portions of the dielectric region 126 and respective portions of the cavity 130. Stated another way, the diameter H of the drill bit used to remove the unused portion 128 may be smaller than the cross-sectional dimensions C and C' of the antipads 124g-l. In an example embodiment, the cross-sectional dimensions C and C' of the antipads 124g-l may be predetermined to be slightly greater than the diameter H of the drill used to remove the unused portions 128. Thus, the second antipad, for instance a select one of the antipads 124g-r, and a third antipad, for instance a select one of the antipads 124h-i, 124k-l, 124n-o, and 124q-r, can be least partially defined by the single back drilled cavity 130 that extends at least from the second antipad to the third antipad along the transverse direction T.

Figure 4B:
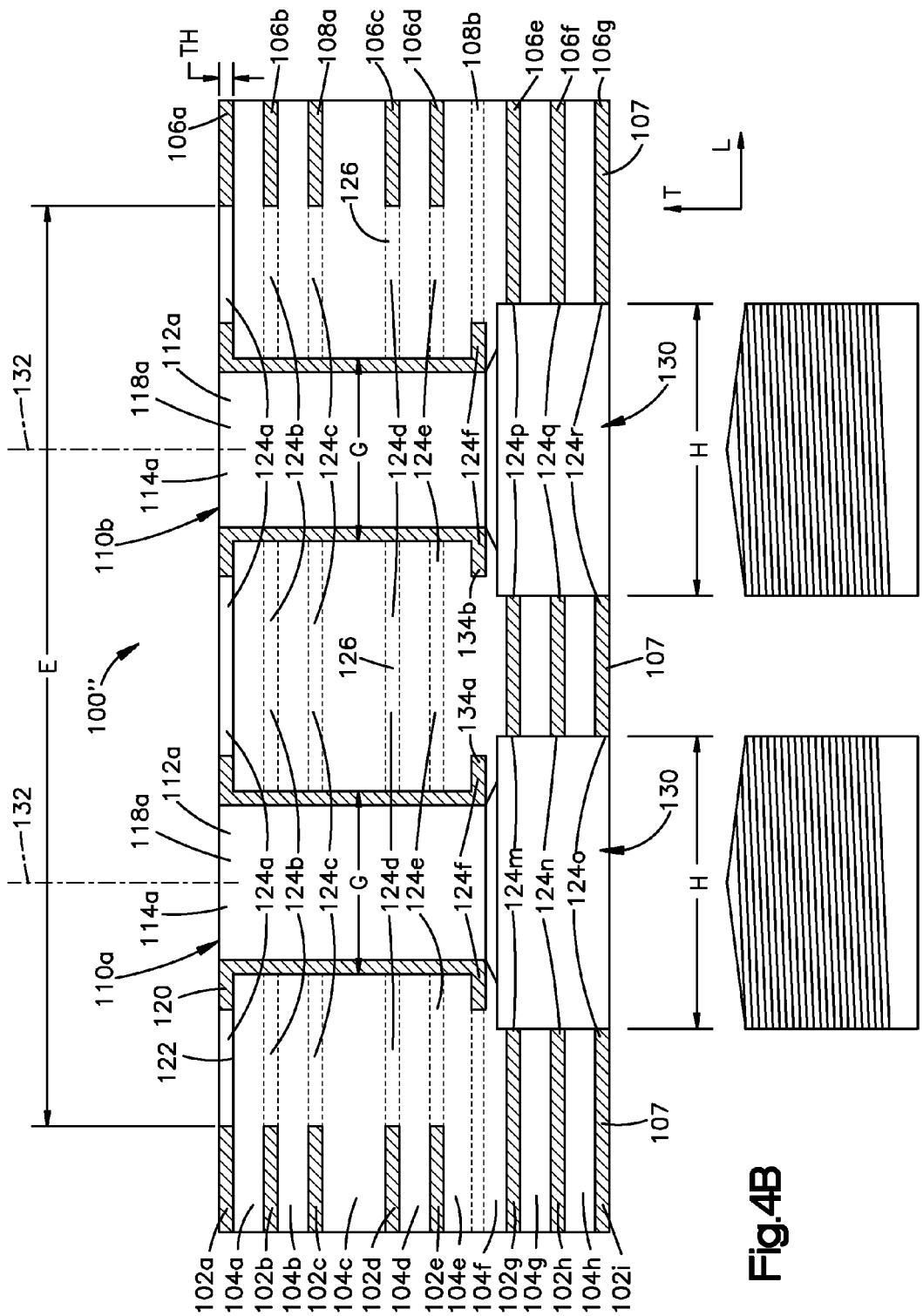

Referring to FIGS. 4A-B, the diameter H of the drill may be larger than the cross-section dimensions F and F' of the antipads 124m-r. Thus, when the unused portions 128 of vias 110a-b are removed, the section of the conductive layers 102g-i and the dielectric layers 104f-h can be removed to create the cavity 130 having the diameter H. Due to back drilling the PCB 100'', for instance, the antipads 124m-r can have the cross-sectional dimension H that is measured from opposed sides of the cavity 130 along a direction that is perpendicular to the transverse direction T, and antipads 124m-r can have the cross-section dimension H that is increased from the cross-section dimensions F and F'. Thus, the maximum area of the antipads 124m-r along respective planes that are normal to the transverse direction T can also be increased by back drilling the PCB 100''. By removing the unused portion 128 and the section of conductive layers 102g-i, in particular sections of the conductive regions 107 of the conductive layers 102g-i, the conductive regions 107 of the conductive layers 102g-i are electrically separate from the vias 110a-b. Further, select conductive regions 107, for instance the second and third electrically conductive regions, of the conductive layers 102g-i come into contact with the single back drilled cavity 130 in accordance with the illustrated embodiment shown in FIGS. 4A-B.

Referring to FIGS. 3A-B, a select two conductive regions, for instance the conductive regions 107 of the conductive layers 102g-i, do not come into contact with the single back drilled cavity 130. Alternatively, referring to FIGS. 4A-B, another select two conductive regions, for instance the conductive regions 107 of conductive layers 102g-i of FIG. 4A, come into contact with the back drilled cavity 130.

Referring generally to FIGS. 1A-4B, the vias 110a-b may be elongate along the transverse direction T and the vias 110a-b can be cylindrical. In accordance with the illustrated embodiments, the via 110a can be centered around a first center line 132a that extends along the transverse direction T, and the via 110b can be centered around a second centerline 132b that extends along the transverse direction T. For instance, the vias 110a-b can define respective cylinders that define the centerlines 132a-b. In accordance with the illustrated embodiment, the centerline 132a can extend through respective centers of select antipads 124, for instance the second and the third antipads, and the centerline 132b can extend through respective centers of select antipads 124, for instance the fourth and the fifth antipads, along the transverse direction T. At least a portion, for instance all, of the antipads 124g-r can be aligned with the respective vias 110a-b such that the respective centerlines 132 pass through the antipads 124g-r along the transverse direction T. For instance, the antipads 124g-i and 124m-o can be aligned with the via 110a along the transverse direction T such the center line 132 passes through a respective center of the antipads 124g-i and 124m-o along the transverse direction T. Similarly, the antipads 124j-l and 124p-r can be aligned with the via 110b along the transverse direction T such that the center line 132b passes through a respective center of the antipads 124j-l and 124p-r along the transverse direction T. In accordance with the illustrated embodiments, when the unused portions 128 of the vias 110a-b are removed by back drilling, the drill bit may be inserted along the center lines 132a-b along the transverse direction, which can result in at least a portion, for instance all, of the cavities 130 being aligned with the vias 110a-b along the transverse direction T. For instance, the cavity 130 can be aligned with the respective vias 110a-b such that the respective center line 132a-b passes through a respective center of the cavity 130 along the transverse direction T.

Without being bound by theory, by minimizing the size of the antipads 124g-r, as depicted in FIGS. 3A-4B, the amount of layer-to-layer cross talk can be reduced. Further, the layer-to-layer cross talk can be reduced by the antipads 124g-r assuming cylindrical shapes with circular cross-sectional areas along respective planes that are normal to the transverse direction T, while the antipads 124a-e can be rectangular shaped.

Referring to FIGS. 5A-B, a PCB 200 can include at least three planar conductive layers 202 such as electrically conductive layers 202a-c. In accordance with the illustrated embodiment, the planar conductive layers 202a-c can each define a thickness in the transverse direction T. The conductive layers 202a-c can be spaced from each other along the transverse direction T. For instance, in accordance with the illustrated embodiment, the conductive layer 202b is in between the conductive layers 202a and 202c along the transverse direction T, and the conductive layers 202a and 202c can be referred to as a top layer 202a and a bottom layer 202c, respectively. Because no other conductive layer is placed between the conductive layers 202a-c along the transverse direction T, the conductive layers 202a-c may also be referred to as consecutive conductive layers 202a-c. The conductive layer 202b can be configured as a ground layer 206b and the conductive layers 202a and 202c can be configured as signal layers 206a and 206c, respectively. Thus, the conductive layer 202b can include conductive regions 207 and one more antipads 210. The conductive layers can also be configured as power layers as desired.

The signal layers 206a and 206c can each include one or more conductive traces 208. In accordance with the illustrated embodiment, the signal layer 206a includes a first differential pair 208a of electrical signal traces, and the signal layer 206c includes a second differential pair 208b of electrical signal traces. Each of the differential pairs 208a-b of signal traces includes two conductive traces 208 that are elongate in the longitudinal direction L and spaced from each other along the lateral direction A. The conductive traces 208 can be made of copper or any other electrically conductive material as desired. The first differential pair 208a of electrical signal traces can define a first centerline 216a centrally disposed between the electrical signal traces 208 of the first differential signal pair 208a. The second differential pair 208b of electrical signal traces can define a second centerline 216b centrally disposed between the electrical signal traces 208 of the second differential signal pair 208b.

The PCB 200 can further include one or more dielectric or electrically insulative layers 204, for instance dielectric layers 204a-b, that are located between the conductive layers 202a-c along the transverse direction T. In accordance with the illustrated embodiment, the dielectric layer 204a is located between the signal layer 206a and the ground layer 206b along the transverse direction T, and the dielectric layer 204b is located between the signal layer 206c and the ground layer 206b along the transverse direction T. The ground layer 206b may include the conductive region 207 that consists of conductive material such as copper. The dielectric layers 204a-b may include substrate material such as plastic.

The PCB 200, and in particular the electrically conductive layer 202b, may further include antipads 210 arranged in a first row R1 along the longitudinal direction L. The PCB 200 may further include antipads 210 arranged in a second row R2 along that longitudinal direction L. The first row R1 can be spaced from the second row R2 a second distance D2 along the lateral direction A. In accordance with the illustrated embodiment, the antipads 210 can define a rectangular shape, although it will be understood that the antipads can be alternatively shaped as desired. The PCB 200 can further include ground vias 212 that are disposed between antipads 210 along the longitudinal direction L. For instance, in accordance with the illustrated embodiment, one ground via is disposed between each pair of adjacent antipads 210 along the row R1 and one ground via is disposed between each pair of adjacent antipads 210 along the row R2, although it will be understood that any number of ground vias can be alternatively located as desired. While not shown in FIGS. 5A and 5B, the antipads 210 can include one or more signal vias.

With continuing reference to FIGS. 5A-B, the differential signal pair 208a can define an edge 214a that is proximate to the first row R1 along the lateral direction A. For instance, the edge 214a can be a third distance D3 from a select one of the antipads 210 in the first row R1 as measured in a straight line along the lateral direction A. The differential signal pair 208a can further define an edge 215a that is opposite the edge 214a and that is proximate to the second row R2 along the lateral direction A. The edge 215a that is opposite the edge 214a can be a fourth distance D4 from a select one of the antipads 210 in the second row R2 as measured in a straight line along the lateral direction A. The edge 214a can be spaced from the opposed edge 215a a first distance D1a. The sum of the third distance D3, the first distance D1a, and the fourth distance D4 may equal the second distance D2.

The differential signal pair 208b can define an edge 214b that is proximate to the first row R1 along the lateral direction A. For instance, the edge 214b can be a fifth distance D5 from a select one of the antipads 210 in the first row R1 as measured in a straight line along the lateral direction A. The differential signal pair 208b can further define an edge 215b that is opposite the edge 214b and that is proximate to the second row R2 along the lateral direction A. The edge 215b that is opposite the edge 214b can be a sixth distance D6 from a select one of the antipads 210 in the second row R2 as measured in a straight line along the lateral direction A. The edge 214b can be spaced from the opposed edge 215b a first distance D1b that can be substantially equal to the first distance D1a. Thus, the electrical signal traces 208 of the first differential pair 208a of signal traces can be spaced apart from each other a first distance D1a along the second or lateral direction A, wherein the first distance can be substantially equal to a distance that the electrical signal traces 208 in the second differential pair 208b of signal traces are spaced apart from each other in the lateral direction A. The sum of the fifth distance D5, the first distance D1b, and the sixth distance D6 can equal the second distance D2.

In accordance with the illustrated embodiment, the third distance D3 may be substantially equal to the sixth distance D6. Thus, the PCB 200 can include the electrically conductive layer 202b disposed between the first differential signal pair 208a and the second differential signal pair 208b along the transverse direction T, and the electrically conductive layer 202b can further include the electrically conductive region 207 and one more antipads 210, for instance first and second antipads 210, that are defined by the electrically conductive region 207. For instance, the first antipad 210 can be disposed in the first row R1 and the second antipad 210 can be disposed in the second row R2. Thus, the first and second antipads 210 can be spaced from each other along the lateral direction A that is perpendicular to the transverse direction T. In accordance with the illustrated embodiment, each of the first and second differential pairs 208a and 208b can be disposed between the first and second antipads 210 with respect to the lateral direction A. Further, in accordance with the illustrated embodiment, the first centerline 216a can be disposed closer to the first antipad 210 than the second antipad 210 along the lateral direction A, and the second centerline 216b can disposed closer to the second antipad 210 than the first antipad 210 along the lateral direction A. Thus, the fourth distance D4 can be greater than the sixth distance D6. Further, the fifth distance D5 can be greater than the third distance D3.

With continuing reference to FIGS. 5A-B, a portion of the first differential pair 208a of electrical signal traces can be aligned with a portion of the second differential pair 208b of electrical signal traces along the transverse direction T. For instance, the fourth distance D4 may be substantially equal to the fifth distance D5 such that a portion of the first differential pair 208 is aligned with a portion of the second differential pair 208b along the transverse direction T. Similarly, the third distance D3 can be substantially equal to the sixth distance D6 such that a portion of the first differential pair 208 is aligned with a portion of the second differential pair 208b along the transverse direction T. For instance, portions of the differential signal pairs 208a-b can aligned along the transverse direction T such that a distance between the edge 215a and the edge 214b is less than the first distances D1a and D1b.

The first centerline 216a can be disposed closer to the antipads 210 in the first row R1 than the antipads 210 in the second row R2, and the second centerline 216b can be disposed closer to the antipads 210 in the second row R2 than the antipads 210 in the first row R2 by selecting appropriate values for the distances D3, D4, D5, and D6. For example, as depicted in FIG. 5B, the distance D3 is less than the distance D5 and the distance D4 is greater than the distance D6, which can result in the edges 214a and 214b being offset (spaced) from one another along the lateral direction A. While FIG. 5B depicts one example, it should be appreciated that a wide variety of values can be assigned to the distances D3, D4, D5, and D6 to result in the first centerline 216a being disposed closer to the first row R1 than the second row R2 along the lateral direction A, and the second centerline 216b being disposed closer to the second row R2 than the first row R1 along the lateral direction A.

Without being bound by theory, by spacing the centerlines 216a and 216b with respect to each other along the lateral direction A, it may be possible to reduce electromagnetic interference, such as cross talk, between the signal pairs 208a and 208b. This may be accomplished by preventing or reducing the alignment of the magnetic field of the signal pair 208a with the magnetic field of the signal pair 208b. Additionally, as magnetic fields are circular, the magnetic wave generated by, for example, the edge 214a would have to travel in a large circular path in order to reach the edge 215a. This may increase the electrical distance magnetic waves would have to travel, thus making those waves reaching the edge 215 weaker. Further, the larger the circular path becomes, the higher the likelihood magnetic waves impact another ground layer, which may be disposed below the signal pair 208a along the transverse direction T, and become absorbed. The above also applies to the magnetic waves from the signal pair 208b to the signal pair 208a In accordance with one embodiment, a method can be provided for reducing layer-to-layer crosstalk. The method can include the step of providing or teaching the use of a PCB, such as either of PCB 100' or PCB 100" as described in connection with FIGS. 1A-2B. The method may further include the teaching the step of back drilling, as described above in connection with FIGS. 3A through 4B, the PCB along an upward direction so as to remove at least a portion of the electrically conductive material. The method may further include selling to the third party the printed circuit board.

In accordance with one embodiment, a method can be provided for reducing layer-to-layer crosstalk. The method can include the step of providing or teaching to a third party the use of a PCB board comprising a first electrically conductive layer that includes a first electrically conductive region and a first antipad defined by the first electrically conductive region, the first antipad including a first dielectric region and a portion of a first electrically plated via that extends through the first dielectric region along a first direction, the first antipad having a first maximum area along a first plane that is normal to the first direction, wherein the first dielectric region is aligned with the first electrically conductive region along the first plane. The method can further include the step of providing or teaching to a third party the use of the PCB board that further includes a second electrically conductive layer disposed below the first dielectric layer along the first direction, the second electrically conductive layer including a second electrically conductive region and a second antipad defined by the second electrically conductive region, the second antipad having a second maximum area along a second plane that is normal to the first direction, the second maximum area less than the first maximum area. The method may further include teaching the step to the third party of applying a first differential pair of electrical signal traces and a second differential pair of electrical signal traces to opposed sides of an electrically conductive ground layer, wherein the first differential pair of electrical signal traces is disposed closer to the first antipad than the second antipad along a second direction that is perpendicular to the first direction, wherein the second differential pair of electrical signal traces is disposed closer to the second antipad than the first antipad along the second direction, and wherein each of the first and second differential pairs is disposed between the first and second antipads. The method may also include selling the PCB board to the third party or purchasing the PCB board, which may include the first and the second differential pairs of signal traces, from the third party.

The embodiments described in connection with the illustrated embodiments have been presented by way of illustration, and the present invention is therefore not intended to be limited to the disclosed embodiments. Furthermore, the structure and features of each of the embodiments described above can be applied to the other embodiments described herein, unless otherwise indicated. Accordingly, the invention is intended to encompass all modifications and alternative arrangements included within the spirit and scope of the invention, for instance as set forth by the appended claims.

What is claimed:

1. A printed circuit board comprising:
a first electrically conductive layer that includes a first electrically conductive region and a first antipad defined by the first electrically conductive region, the first antipad including a first dielectric region and a portion of a first electrically plated via that extends through the first dielectric region along a first direction, the first antipad having a first maximum area along a first plane that is normal to the first direction, wherein the first dielectric region is aligned with the first electrically conductive region along the first plane;
a first dielectric layer disposed below the first electrically conductive layer along the first direction;
a second electrically conductive layer disposed below the first dielectric layer along the first direction, the second electrically conductive layer including a second electrically conductive region and a second antipad defined by the second electrically conductive region, the second antipad having a second maximum area along a second plane that is normal to the first direction, the second maximum area less than the first maximum area;
a third electrically conductive layer disposed below the second electrically conductive layer along the first direction such that no additional electrically conductive layer is disposed between the second electrically conductive layer and the third electrically conductive layer along the first direction, the third electrically conductive layer defining a third electrically conductive region and a third antipad, the third antipad having a third maximum area along a third plane that is normal to the first direction, the third maximum area substantially equal to the second maximum area; and an electrically conductive signal layer that includes one or more electrically conductive traces electrically coupled to the first electrically plated via, the electrically conductive signal layer being the only signal layer disposed between the first electrically conductive layer and the second electrically conductive layer along the first direction, wherein at least a portion of each of the second antipad and the third antipad is aligned with the portion of the first electrically plated via along the first direction.

2. The printed circuit board of claim 1, wherein the first antipad further includes a portion of a second electrically plated via that extends through the first dielectric region along the first direction, wherein the second electrically conductive layer further includes a fourth antipad defined by the second electrically conductive region, the fourth antipad having a fourth maximum area along the second plane, the fourth maximum area substantially equal to the second maximum area, wherein the third electrically conductive layer further includes a fifth antipad defined by the third electrically conductive region, the fifth antipad having a fifth maximum area along the third plane, the fifth maximum area substantially equal to the third maximum area.

3. The printed circuit board of claim 1, wherein each of the second antipad and the third antipad are at least partially defined by a single back drilled cavity that extends at least from the second antipad to the third antipad along the first direction.

4. The printed circuit board of claim 3, wherein each of the second electrically conductive region and the third electrically conductive region do not come into contact with the single back drilled cavity.

5. The printed circuit board of claim 3, wherein at least one of the second electrically conductive region and the third electrically conductive region comes into contact with the single back drilled cavity.

6. The printed circuit board of claim 3, wherein the single back drilled cavity is at least partially filled with a dielectric medium.

7. A printed circuit board comprising:
a first signal layer comprising a first differential pair of electrical signal traces that defines a first centerline oriented along a transverse direction, wherein the first centerline is centrally disposed between the electrical signal traces of the first differential signal pair with respect to a lateral direction;
a second signal layer comprising a second differential pair of electrical signal traces spaced from the first differential pair along the transverse direction, the second differential pair defining a second centerline centrally oriented along the transverse direction, wherein the second centerline is disposed between the electrical signal traces of the second differential signal pair with respect to the lateral direction; and
an electrically conductive layer disposed between the first differential signal pair and the second differential signal pair with respect to the transverse direction, wherein the first centerline and the second centerline are offset with respect to each other along the lateral direction to reduce electromagnetic interference between the first differential signal pair and the second differential signal pair, wherein the first differential pair of electrical signal traces defines the first centerline such that the first centerline is centrally disposed between no differential pairs of electrical signal traces of the second signal layer.

8. The printed circuit board of claim 1, further comprising:
a second dielectric layer disposed between the second electrically conductive layer and the third electrically conductive layer such that the second dielectric layer separates the second and third electrically conductive layers from each other and the second dielectric layer abuts each of the second and third electrically conductive layers.

9. The printed circuit board of claim 1, wherein the second and third maximum areas are circular.

10. The printed circuit board of claim 9, wherein the first maximum area is rectangular.

11. The printed circuit board of claim 1, wherein the first, second, and third electrically conductive layers are ground layers.

12. The printed circuit board of claim 1, wherein the first electrically plated via defines a cylinder defining a centerline that extends through respective centers of the second antipad and the third antipad along the first direction.

13. The printed circuit board of claim 2, wherein the second electrically plated via defines a cylinder defining a centerline that extends though respective centers of the fourth antipad and the fifth antipad along the first direction.

14. The printed circuit board of claim 3, wherein the first electrically plated via defines a cylinder defining a centerline that passes through a respective center of the single back drilled cavity along the first direction.

15. A printed circuit board comprising:
a first differential pair of electrical signal traces that defines a first centerline centrally disposed between the electrical signal traces of the first differential signal pair;
a second differential pair of electrical signal traces spaced from the first differential pair along a first direction, the second differential pair defining a second centerline centrally disposed between the electrical signal traces of the second differential signal pair; and
an electrically conductive layer disposed between the first differential signal pair and the second differential signal pair along the first direction, the electrically conductive layer including an electrically conductive region and first and second antipads that are defined by the electrically conductive region, the first and second antipads spaced from each other along a second direction that is perpendicular to the first direction, wherein each of the first and second differential pairs is disposed between the first and second antipads with respect to the second direction; and
at least one ground via spaced from each of the first and second antipads along a third direction that is substantially perpendicular to both the first and second directions,
wherein the first centerline is disposed closer to the first antipad than the second antipad along the second direction, and the second centerline is disposed closer to the second antipad than the first antipad along the second direction.

16. The printed circuit board claim 15, wherein a portion of the first differential pair of electrical signal traces is aligned with a portion of the second differential pair of electrical signal traces along the first direction.

17. The printed circuit board of claim 15, wherein the electrical signal traces of the first differential pair of signal traces are spaced apart from each other a first distance along the second direction, wherein the first distance is substantially equal to a distance that the electrical signal traces of the second differential pair of signal traces are spaced apart from each other along the second direction.

18. The printed circuit board of claim 15, wherein a first dielectric layer is disposed between the first differential pair of signal traces and the electrically conductive layer along the first direction, and a second dielectric layer is disposed between the second differential pair of signal traces and the electrically conductive layer along the first direction.

19. The printed circuit board of claim 15, wherein the first centerline is disposed a first distance from the first antipad along the second direction, first distance being substantially equal to a second distance that the second centerline is disposed from the second antipad along the second direction.

20. The printed circuit board as recited in claim 7, wherein the electrical signal traces of the first differential pair of electrical signal traces are spaced apart from each other a first distance with respect to the lateral direction, and the first distance is substantially equal to a distance that the electrical signal traces of the second differential pair of electrical signal traces are spaced apart from each other with respect to the lateral direction.

21. The printed circuit board as recited in claim 7, wherein:
the printed circuit board further comprises:
a first row of antipads, the first row extending perpendicular to the lateral direction and the transverse direction; and
a second row of antipads parallel to the first row of antipads; and
the first differential pair of electrical signal traces and the second differential pair of electrical signal traces are disposed, in the lateral direction between the first row of antipads and the second row of antipads.

22. The printed circuit board as recited in claim 7, wherein the transverse direction is substantially perpendicular to the lateral direction.

23. The printed circuit board as recited in claim 7, wherein a first dielectric layer is disposed between the first differential pair of electrical signal traces and the electrically conductive layer with respect to the transverse direction, and a second dielectric layer is disposed between the second differential pair of electrical signal traces and the electrically conductive layer with respect to the transverse direction.

24. The printed circuit board as recited in claim 7, wherein the second differential pair of electrical signal traces defines the second centerline such that the second centerline is centrally disposed between no differential pairs of electrical signal traces of the first signal layer.

25. The printed circuit board as recited in claim 7, wherein a portion of the first differential pair of electrical signal traces is aligned with a portion of the second differential pair of electrical signal traces with respect to the transverse direction.

\* \* \* \* \*